United States Patent [19]

Veigel

[11] 4,009,090
[45] Feb. 22, 1977

[54] SPUTTER-COATING OF GLASS SHEETS OR OTHER SUBSTRATES

[75] Inventor: Neil D. Veigel, Novi, Mich.

[73] Assignee: Shatterproof Glass Corporation, Detroit, Mich.

[22] Filed: Dec. 3, 1975

[21] Appl. No.: 637,281

[52] U.S. Cl. .............................. 204/192; 204/298
[51] Int. Cl.² ........................................ C23C 15/00
[58] Field of Search ........................... 204/192, 298

[56] References Cited
UNITED STATES PATENTS

| | | | |
|---|---|---|---|
| 3,890,217 | 6/1975 | Burrows et al. | 204/298 |
| 3,904,506 | 9/1975 | Carmichael et al. | 204/298 |
| 3,916,523 | 11/1975 | Lane et al. | 30/346.53 |
| 3,945,911 | 3/1976 | McKelvey | 204/298 |

Primary Examiner—Anthony Skapars
Assistant Examiner—Aaron Weisstuch
Attorney, Agent, or Firm—William E. Nobbe

[57] ABSTRACT

A cathode for use in the sputter-coating of thin films of a selected coating material on glass sheets and other substrates, and means for cooling the same. The cathode is of rectangular construction including a top wall, a bottom wall and side and end walls defining a closed chamber therein. The cathode is internally cooled by circulating a cooling medium, such as oil, under a constant head pressure, through a closed system in which the cathode is interposed, and means for continuously withdrawing air and any other gases from the system such that as the oil circulates through the cathode chamber it will exert a pressure, less than atmospheric pressure, upon the walls of said cathode and thereby reduce the pressure differential across the cathode walls.

11 Claims, 4 Drawing Figures

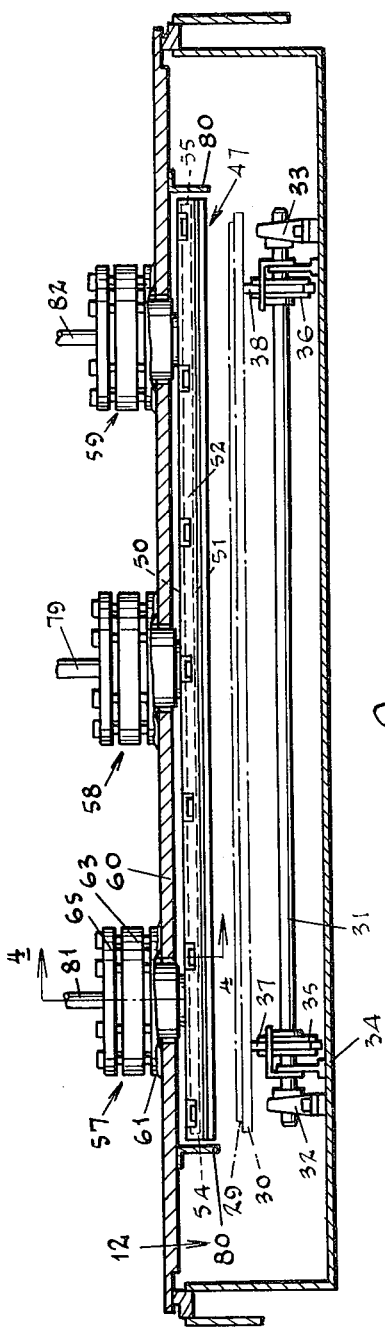

SPUTTER-COATING OF GLASS SHEETS OR OTHER SUBSTRATES

BACKGROUND OF THE INVENTION

The present invention relates to improvements in the coating of glass sheets or other substrates with thin films of a selected coating material and more particularly to the coating of such substrates by the cathode sputtering process.

The process of sputter-coating involves ion bombarding a target of the coating material in an ionized gas atmosphere in a chamber in which a controlled vacuum is maintained to cause atomic particles of the coating material to be dislodged and deposited on the substrates to be coated. One type of apparatus employed for carrying out the process embodies a plurality of aligned, independently controlled contiguous chambers including an entry chamber, a coating chamber and an exit chamber, sputter-coating means in the form of a substantially rectangular cathode mounted horizontally in the upper portion of the coating chamber and having a sheet or layer of a selected coating material carried by the bottom surface thereof and conveyor means for moving the substrates (glass sheets) in a horizontally disposed position through the successive chambers and beneath the sputter-coating means such that a continuous film of the selected coating material will be deposited on the upper surfaces of the substrates. The cathode comprises a housing including a top wall, a bottom wall and side and end walls which define a closed chamber therein. The walls of the cathode are preferably formed of aluminum of the desired thickness and are welded together along their meeting edges.

In such a process, the thin films deposited on the substrates are usually of a metal such as, for example, nickel, gold, chromium, copper, molybdenum or titanium, or alloys of these metals. Typical sputtering conditions are 5,000 volts potential on the target (coating material) and a resulting current density of 0.1 to 1.0 ma/cm$^2$ for a time period of 0.2 to several minutes depending on the thickness of coating desired. It will be appreciated that this potential on the target in the ionized gas atmosphere of the coating chamber will generate a very high temperature which tends to heat the metal cathode to an undesirable degree. On the other hand, it is desirable that the cathode be operated as hot as possible without damage to the materials of which it is constructed since the heat aids in keeping the cathode in a clean and operable condition.

In order to maintain acceptable working conditions, it is essential that the cathodes be maintained at a temperature compatible with the materials of construction and to this end different methods have been proposed for effecting the cooling thereof. However, the cooling procedures heretofore utilized have not proven wholly satisfactory in meeting the requirements of continuous commercial operation.

A typical cooling procedure heretofore utilized has been to circulate ordinary tap water directly from the water main through the cathode chamber at a pressure of such magnitude that it will exert a pressure of about 3 lbs. p.s.i. on the walls of the cathode. However, this pressure together with the atmospheric pressure of about 14.7 lbs. p.s.i. on the water supply results in a total pressure of about 17.7 lbs. p.s.i. being imposed on the walls of the cathode. On the other hand, in the operation of a continuous sputter-coating apparatus of the character referred to above, the coating chamber is pumped down from atmosphere to a pressure usually in the range of 2 to 6×10$^{-2}$ torr and preferably of about 4×10$^{-2}$ torr, which pressure is maintained constant. The outward pressure exerted by the tap water on the walls of the cathode coupled with the vacuum created within the coating chamber places an undue stress on the walls of the cathode and more particularly on the welded joints securing the walls together. The resulting steady rate of stress, commonly referred to as creep, causes a gradual weakening and eventual rupture of the welded joints between the walls of the cathode resulting in leaks which necessitates removal of the cathode for repair and replacement. This is, of course, highly objectional not only from the standpoint of increased maintenance costs but also because of the loss of production time.

The present invention comprehends a new and improved procedure for internally cooling the cathodes employed in the sputter-coating of thin films of a material on glass sheets or other substrates.

Another object of the invention is the provision of an improved method and apparatus which involves the internal cooling of the cathode by circulating a cooling medium, such as oil, therethrough under a constant head pressure in such a manner as to reduce the pressure differential across the cathode walls and thereby minimize the stresses and resulting strains therein.

A further object of the invention is the provision of a method and apparatus in which air and other gases are continuously withdrawn from the cooling system as the oil circulates through the cathode such that the pressure of the oil upon the walls of the cathode is less than atmospheric pressure.

BRIEF DESCRIPTION OF THE DRAWINGS

FIG. 3 is a vertical transverse section taken substantially along line 3—3 of FIG. 1, and FIG. 4 is a vertical section through the cathode taken substantially along line 4—4 of FIG. 3.

DESCRIPTION OF THE PREFERRED EMBODIMENT

Figure 1:
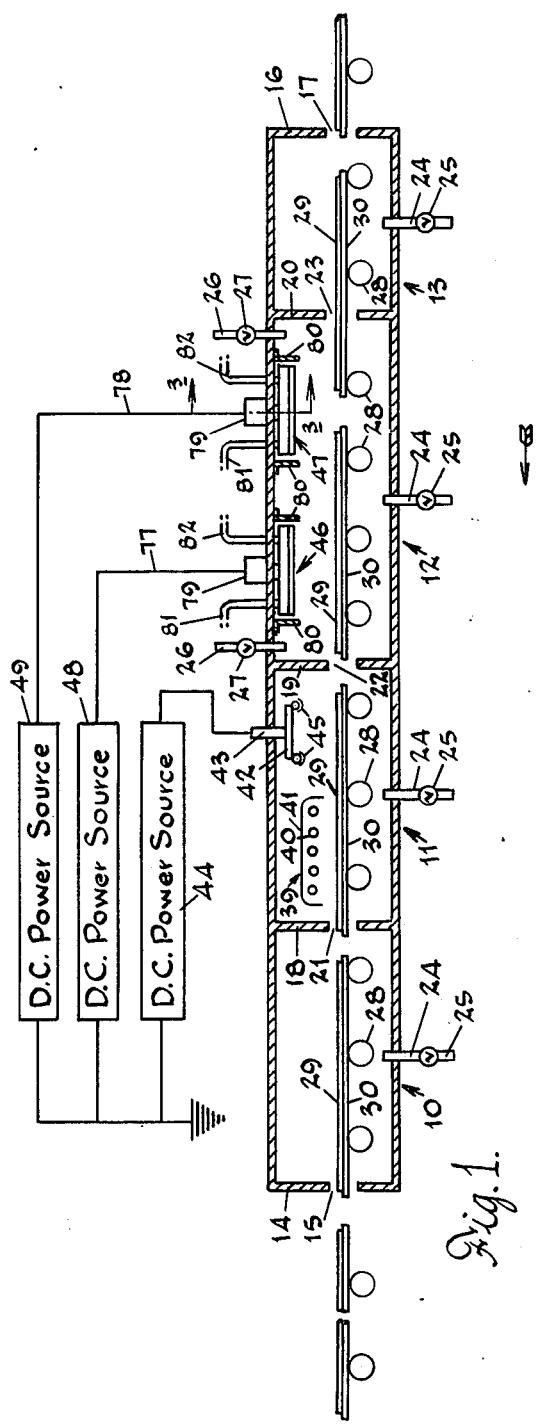
FIG. 1 is a vertical longitudinal sectional view through one form of continuous sputter-coating apparatus with which the present invention may be employed.

The sputter-coating apparatus illustrated in FIG. 1, with which the present invention may be employed, comprises four successive, contiguous enclosures which define four independently controlled chambers — an entry chamber 10, a heating and cleaning chamber 11, a coating chamber 12 and an exit chamber 13. The chambers are rectangular in shape and the dimensions thereof, especially the height, are kept to a minimum in order to minimize the internal volume and thereby the vacuum pumping required.

Each of the chambers is substantially closed except for an elongated entrance opening and an elongated exit opening. The outer wall 14 of the entry chamber 10 is provided with an entrance opening 15, while the outer end wall 16 of exit chamber 13 is provided with a discharge opening 17. The chambers are also separated by partition walls 18, 19 and 20 provided with similar openings 21, 22 and 23 respectively. All of the openings are positioned at the same height to allow for ingress and egress of the glass sheets or other substrates as they are moved into, through and out of the successive chambers. Preferably, quick-opening and closing vacuum-tight closures are provided over at least some of the elongated openings to reduce the vacuum pumping requirements. These closures are open when a substrate is moved through the opening and closed when no substrate is in the opening.

Each of the chambers is provided with at least one oulet tube 24, preferably located at the bottom of the chamber. Each tube communicates with the vacuum pump (not shown) and a valve 25 is provided on each tube to independently control the pressure within the respective chamber. Inlet tubes 26 extend through the top of the coating chamber and communicate with a source of inert gas, preferably argon. A valve 27 is provided on each tube 26 to control the flow of gas into the coating chamber.

Conveyor means indicated generally by the numeral 28 are located in the lower portion of the chambers to transport the substrates 29 to be coated through the sequence of chambers. The substrates are preferably carried upon rigid metal platens 30. The conveyor means illustrated in FIG. 3 comprises a plurality of horizontally aligned transverse shafts 31 mounted at opposite ends in bearings 32 and 33 supported upon the base 34 of the apparatus. Keyed to each shaft 31, adjacent the opposite ends thereof, are gears 35 and 36 and trained about these gears are endless chains 37 and 38 respectively which convey the platens and substrates through successive chambers. The endless chains are driven by suitable drive means, not shown.

Heating means 39 (FIG. 1) comprising elongated, tubular radiation heaters 40, are mounted in the upper portion of the chamber 11. These heaters are preferably high-intensity radiation heaters and a reflector 41, mounted above the heaters, is used to concentrate the heat on the passing substrates 29. The substrates are heated prior to coating to promote outgassing and thereby attain additional surface cleaning and improved adherence of the coating. A glow-discharge cleaning electrode 42, which may be in the form of a closed loop, is located at the top of chamber 11. The electrode is supported by a rod 43 and voltage is supplied to the electrode by the high-voltage D.C. power source 44. One side of the source is grounded and the other side thereof connected to the rod 43. Shields 45 may be positioned below the electrode that are just large enough to prevent the substrates from "seeing" the electrode as they pass through the chamber. The electrode may be operated either as an ordinary sputtering electrode with the shields which prevent the electrode material from being deposited on the substrates or at power levels below that required for sputtering without the shields. The ionized ions of the gas will bombard the surfaces of the substrates to clean them but no sputtered material is deposited in either case.

Sputter-coating cathodes 46 and 47 (to be more fully hereinafter described) are mounted in the upper portion of the coating chamber 12. The cathodes are used to deposit a thin film of a metal on the substrates and voltage is applied to these cathodes by high-voltage D.C. power sources 48 and 49 respectively. All power sources are preferably grounded to the apparatus such that the apparatus will act as the anode for the cleaning and sputtering operations.

In practice, one or more cathodes may be used in the coating chamber. Several cathodes of different materials may be applied consecutively as, for example, making cathode 46 of one metal and cathode 47 of a different metal. Or the cathode 47 may be used to deposit a thin protective layer of a siliceous material, such as Pyrex glass on a previously deposited film of metal. Also the coating chamber can be increased in length and a greater number of cathodes of the same material used to increase the deposition rate and therefore the production rate.

In operation, the glass sheet substrates to be coated are first cleaned by a conventional washing operation and are then passed into the entry chamber 10, with the smooth continuous surface to be coated facing upward. The vacuum pumping in the entry chamber removes most of the air, moisture, and other contaminates which may leak in through the entrance opening. The substrates 29, carried by the platens 30, are moved by the conveyor means 28 into the heating and cleaning chamber 11 where they are heated by the heaters 40 and then cleaned by the cleaning electrode 42. The substrates then move at a controlled speed into the coating chamber 12 where a continuous film of the selected coating material or materials is sputtered on the clean upper surfaces thereof. After being coated, the substrates move into the exit chamber 13 where they are cooled before being removed from the apparatus through the opening 17.

As brought out above, under typical operating conditions, 5,000 volts potential may be applied on the target (coating material) and this high potential generates an excess amount of heat that must be rapidly removed in order to produce a commercially satisfactory coating on the substrates without damage to the apparatus or the glass substrates. The present invention is particularly concerned with the provision of a new and improved method and means for effecting a more controlled functioning of the cathode.

Each of the cathodes 46 and 47, as illustrated in FIGS. 3 and 4, is of substantially boxlike form comprising a housing including a top wall 50, a bottom wall 51, side walls 52 and 53 and end walls 54 and 55 which define within the housing a closed chamber 56. The side and end walls are sealed to the top and bottom walls preferably by welding. The cathodes extend transversely within the coating chamber 12 and are located in the upper portion thereof by support units 57, 58 and 59 mounted on the top wall 60 of the coating chamber 12.

Each of these support units includes a metal ring 61 vertically aligned with an opening 62 in the top wall of the coating chamber. An annular insulating member 63 having a depending collar 64 is disposed above the ring 61, with a cover plate 65, having a central aperture therein, positioned above said insulating member. The ring has tapped holes for receiving bolts 66 passing through openings in the insulating member 63 and cover plate 65. An O-ring 67 is located between the ring 61 and insulating member 63 to provide a vacuum-tight seal, while an O-ring 68 between the insulating member 63 and cover plate 65 serves the same purpose.

Secured to the top wall 50 of the cathode housing, as by welding, is an annular sleeve 69 which is received in concentric relation within the collar 64 depending from insulating member 63. This sleeve is provided at its upper end with a centrally disposed aperture in an inwardly turned rim 70 formed with tapped holes to receive bolts 71 passing through the cover plate 65. An O-ring 72 is located around the bolts to afford an additional vacuum-tight seal.

The coating material (target) is carried by the under surface of the bottom wall 51 of the cathode housing and consists of a sheet or layer 73 of the selected metal or metal alloy which is to be deposited upon the upper surfaces of the substrates as they pass therebeneath. The coating material may be applied to a support plate 74 by electro-plating, brazing, or in some other suitable manner.

A thin foil sheet 75 of a soft, thermally conductive material, such as aluminum or indium, is preferably positioned between the bottom wall 51 of the cathode housing and said support plate 74. This foil sheet serves to increase the area of contact at the interface between the bottom of the cathode housing and said support plate. The support plate is secured to the cathode housing by bolts 76.

The required electrical power for the cathodes 46 and 47 can be supplied thereto from the respective power sources 48 and 49 through power lines 77 and 78 connected to conductor rods 79 associated with the support units 58. Grounded shielding plates 80 are secured to the top wall of the coating chamber a short distance from the edges of the cathodes to prevent reverse sputtering of the material on the edges of the cathodes.

To provide for the continuous circulation of the cooling medium through the cathodes 46 and 47, each cathode is provided with an inlet pipe 81 adjacent one end thereof and an outlet pipe 82 adjacent the opposite end. Each pipe passes downwardly through the aligned apertures in the cover plate 65 and sleeve 69 of the respective support unit 57 and 59 and communicates with the cathode chamber 56 through an opening 83 in the top wall 50 of the cathode housing.

Figure 2:
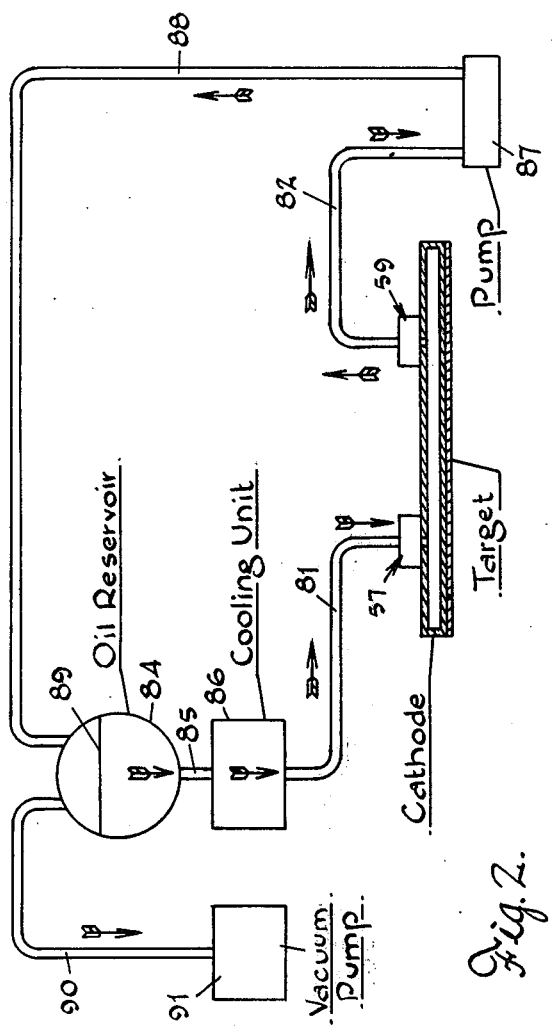
FIG. 2 is a diagramatic view showing the cooling system for the cathode.

The improved means contemplated by the present invention for internally cooling the cathodes is illustrated diagramatically in FIG. 2. Such means comprises a reservoir which may be in the form of an elongated cylindrical tank 84 containing a supply of the oil used for cooling the cathode. Connected to the bottom of the tank 84 is a pipe 85 leading to a cooling unit 86, while connected to the bottom of the cooling unit is one end of the pipe 81, the opposite end of which communicates with the cathode chamber. The outlet pipe 82 conducts the cooling medium from the cathode chamber to a pump 87 which returns the oil through a line 88 back to the tank 84. It will thus be seen that the oil is continuously recirculated through a closed system under a constant head pressure from the reservoir to and through the cathode and, upon exiting from the cathode, is pumped back to the reservoir.

The amount of oil contained in the closed system is such that the tank 84 is maintained about half full, the level of the oil being indicated at 89. Connected to the top of the tank 84 and communicating with the space above the oil supply is one end of a pipe 90 which leads to a vacuum pump 91. The vacuum pump is continuously operated to withdraw any air and other gases from the cooling system. As a result, the pressure of the atmospheric air is substracted from the head pressure of the oil on the walls of the cathode so that the pressure exerted on the walls of the cathode is less than atmospheric pressure. While the pressure exerted on the walls of the cathode housing may vary as operating conditions dictate it is usually in the range of 2 to 8 lbs. p.s.i. and preferably about 3 lbs. p.s.i.

The continued maintenance of the vacuum in the upper part of the tank 84 will effect the withdrawal of air that may leak into the system as well as any gases that may be released from the oil. The oil can be of any type ordinarily recommended for heat transfer applications.

It will thus be apparent that the oil cooling system of the present invention overcomes the objectional features present in prior water cooling systems in that the pressure of the oil on the walls of the cathode will be less than atmospheric pressure. This will, of course, result in reducing the pressure differential across the walls of the cathode housing with a consequent reduction of the stresses and resulting strains therein. This greatly lessens the liability of leaks occurring in the welded joints between the walls of the cathode housing resulting in much less maintenance costs as well as in reduced "down time" in the operation of the coating apparatus. Another advantage in the use of oil as the cooling medium is that it also eliminates corrosion in the system due to salts in the tap water heretofore used.

While this invention is not limited to use with any particular type of cathode, it is of special utility when employed in the internal cooling of the type of cathode described above in a continuous sputtering process.

It is to be understood that the words used herein to describe the invention are words of description rather than of limitation and that the scope of the invention is to be limited only insofar as set forth in the appended claims.

I claim:

1. In the method of sputter-coating glass sheets and other substrates with a thin film of a selected coating material applied by transport from a surface of a sputtering cathode provided with a chamber through which a cooling medium is circulated, the improvement which comprises circulating an oil under a constant head pressure through a closed system in which the cathode is interposed, and continuously withdrawing air and other gases from said system to reduce the pressure differential across the walls of the cathode as the oil circulates through the cathode chamber at less than atmospheric pressure.

2. The improvement of claim 1, wherein the oil is recirculated through the cathode chamber.

3. The improvement of claim 2, wherein the oil is cooled before being returned to the cathode.

4. The improvement of claim 1, wherein the air and other gases are withdrawn from the system by suction.

5. The improvement of claim 1, wherein the supply of oil is contained in a reservoir forming a part of said system, and the air and other gases are withdrawn from said system by creating a vacuum in said reservoir above the supply of oil therein.

6. In apparatus for sputter-coating glass sheets and other substrates with a thin film of a selected coating material, a cathode which includes a housing having a chamber therein, said housing adapted to have a sheet of the coating material applied to a surface thereof, means for internally cooling said cathode comprising a closed cooling system in which the cathode is interposed, said system including means for circulating an oil under constant heat pressure through the chamber in said cathode, and means for continuously withdrawing air and other gases from said system such that the pressure differential across the walls of the cathode chamber is less than atmospheric pressure.

7. Apparatus as claimed in claim 6, in which said cooling system includes a reservoir for the oil, means for conveying the oil from the reservoir to the cathode under a constant head pressure, and means for receiving the oil from the cathode and returning it to said reservoir.

8. Apparatus as claimed in claim 7, in which said cooling system includes means for cooling the oil before it is returned to the cathode.

9. Apparatus as claimed in claim 7, in which said cooling system includes means for cooling the oil before it is returned to the cathode, in which the means for receiving the oil from the cathode and returning it to the reservoir comprises a pump, and in which the means for withdrawing the air and other gases from the system comprises a vacuum pump connected to the reservoir above the level of the oil contained therein.

10. Apparatus as claimed in claim 6, in which said cooling system includes a reservoir for the oil, and in which the means for withdrawing air and other gases from the system comprises means connected with said reservoir.

11. Apparatus as claimed in claim 9, in which said last-named means comprises means for creating a vacuum in said reservoir above the level of the oil therein.

* * * * *